(12) United States Patent
Rao et al.

(10) Patent No.: US 11,217,761 B2
(45) Date of Patent: Jan. 4, 2022

(54) PHOTON MULTIPLYING MATERIAL AND OPTO-ELECTRONIC DEVICES EQUIPPED THEREWITH

(71) Applicant: Cambridge Enterprise Limited, Cambridge (GB)

(72) Inventors: Akshay Rao, Cambridge (GB); Nathaniel Davis, Temora (AU); Jesse Allardice, Cambridge (GB); Chris Rider, Cambridge (GB); Simon Dowland, Cambridge (GB); Jurjen Frederik Winkel, Cambridge (GB)

(73) Assignee: Cambridge Enterprise Limited, Cambridge (GB)

( * ) Notice: Subject to any disclaimer, the term of this patent is extended or adjusted under 35 U.S.C. 154(b) by 0 days.

(21) Appl. No.: 17/059,767

(22) PCT Filed: Jun. 21, 2019

(86) PCT No.: PCT/GB2019/051754
§ 371 (c)(1),
(2) Date: Nov. 30, 2020

(87) PCT Pub. No.: WO2019/243839
PCT Pub. Date: Dec. 26, 2019

(65) Prior Publication Data
US 2021/0210705 A1    Jul. 8, 2021

(30) Foreign Application Priority Data

Jun. 22, 2018  (GB) .................................. 1810291.3

(51) Int. Cl.
*H01L 29/08*  (2006.01)
*H01L 51/44*  (2006.01)
*C09K 11/02*  (2006.01)
*C09K 11/06*  (2006.01)
*H01L 51/00*  (2006.01)

(52) U.S. Cl.
CPC .......... *H01L 51/447* (2013.01); *C09K 11/025* (2013.01); *C09K 11/06* (2013.01);
(Continued)

(58) Field of Classification Search
CPC .... H01L 51/447; H01L 51/0053; C09K 11/06
See application file for complete search history.

(56) References Cited

U.S. PATENT DOCUMENTS

| 5,331,183 A * | 7/1994 | Sariciftci ............... B82Y 10/00 |
| | | 136/263 |
| 2013/0247989 A1* | 9/2013 | Bazan ................. H01L 51/0071 |
| | | 136/263 |

(Continued)

FOREIGN PATENT DOCUMENTS

| WO | 2014052530 | 4/2014 |
| WO | 2016009203 | 1/2016 |
| WO | 2018189527 | 10/2018 |

OTHER PUBLICATIONS

Davis, Nathaniel J.L.K. et al., "Singlet Fission and Triplet Transfer to PbS Quantum Dots in TIPS-Tetracene Carboxylic Acid Ligands," J. Phys. Chem. Lett., vol. 9, No. 6, (2018) pp. 1454-1460.
(Continued)

*Primary Examiner* — Caleb E Henry
(74) *Attorney, Agent, or Firm* — Hartman Global IP Law; Gary M. Hartman; Domenica N. S. Hartman

(57) ABSTRACT

A photon multiplying material includes a first organic semiconductor, a luminescer and a light harvesting material wherein the light harvesting material has a bandgap which provides that exciton states formed in the light harvesting material by absorbance of light can be energy transferred to the first organic semiconductor and the luminescer has a bandgap which provides that triplet exciton states formed in the first organic semiconductor can be energy transferred (Continued)

into the luminescer; and wherein at least one of the first organic semiconductor and the light harvesting material is capable of singlet fission.

22 Claims, 6 Drawing Sheets
(3 of 6 Drawing Sheet(s) Filed in Color)

(52) U.S. Cl.
CPC ........ H01L 51/004 (2013.01); H01L 51/0053 (2013.01); H01L 51/0077 (2013.01)

(56) References Cited

U.S. PATENT DOCUMENTS

| | | | |
|---|---|---|---|
| 2014/0034880 A1* | 2/2014 | Blouin | H01L 51/004 252/500 |
| 2016/0090371 A1* | 3/2016 | Bianchi | H01L 51/0068 526/256 |
| 2016/0238455 A1 | 8/2016 | Congreve et al. | |
| 2017/0141318 A1* | 5/2017 | Campos | H01L 51/4253 |
| 2017/0213813 A1* | 7/2017 | Rao | H01L 31/0304 |
| 2019/0006545 A1* | 1/2019 | Ayzner | B01J 19/127 |

OTHER PUBLICATIONS

Thompson, Nicholas J. et al., "Energy Harvesting of Non-Emissive Triplet Excitons in Tetracene by Emissive PbS Nanocrystals," Nature Materials, vol. 13, No. 11, (2014) pp. 1039-1043.
GB Search Report dated Dec. 24, 2018, for Application No. GB1810291.3, (3 pages).
International Search Report and Written Opinion dated Oct. 7, 2019, for International Application No. PCT/GB2019/051754, (14 pages).

* cited by examiner

PHOTON MULTIPLYING MATERIAL AND OPTO-ELECTRONIC DEVICES EQUIPPED THEREWITH

CROSS REFERENCE TO RELATED APPLICATIONS

This application claims the benefit of PCT/GB2019/051754 filed Jun. 21, 2019, having a priority claim to British Patent Application No. GB 18 10291.3 filed Jun. 22, 2018. The contents of these prior patent documents are incorporated herein by reference.

The present invention is concerned with a photon multiplying film as well as with an opto-electronic device, such as a solar or photovoltaic cell, containing the film.

Low band-gap solar cells like mono- and poly-crystalline silicon represent more than 90% of the global solar photovoltaics market. The highest efficiency (26.3%) using monocrystalline silicon is close to the theoretical limit of 29.4%. Improvements aimed at reducing optical loss and charge recombination are difficult and costly to obtain.

Accordingly, much recent work is directed to approaches which can exceed the theoretical limit. These approaches may be categorised as single junction solar cells with carrier multiplication (maximum theoretical efficiency about 39%), tandem solar cells wherein different combinations of materials are provided with and without carrier multiplication (theoretical efficiency in the range of 39% to 47%) and spectral (up and down) conversion with or without photon multiplication.

The use of singlet fission materials (for example, organic semiconductors) in photovoltaics has been actively researched since around 2006 because of its potential to produce twice the photons or charges within a spectral range.

Singlet fission in organic semiconductors is a spin-allowed process in which a singlet exciton ($S_1$) formed upon light absorption is converted to two triplet excitons ($T_1$).

For singlet fission to occur, the triplet exciton level must be close to half of the energy of the singlet exciton, e.g. $S_1 \cong 2*T_1$. For monocrystalline silicon (band gap $E_g$ of 1.1 eV), singlet fission materials need to have a $S_1$ level of 2.3 to 2.6 eV (blue-green light absorption) and a $T_1$ level of 1.2 to 1.3 eV.

Note that singlet fission can be classified as either endothermic or exothermic. In exothermic fission, the energy of the lowest singlet exciton ($S_1$) is greater than twice the lowest triplet energy ($T_1$), i.e. $S_1 > 2T_1$.

In endothermic fission, the energy of the lowest singlet exciton ($S_1$) is less than twice the lowest triplet energy ($T_1$), i.e. $S_1 < 2T_1$. In this case, the singlet exciton is initially converted to a correlated triplet pair state (TT state) whose energy is close to that of the singlet exciton. The TT state then breaks up via thermal activation into free triplet excitons ($T_1$).

WO 2014/001817 A1 discloses a solar cell in which an organic semiconductor layer capable of multiple exciton generation is provided on an inorganic semiconductor layer.

Photovoltaic efficiency enhancement via singlet fission spectral conversion has also been investigated in solar cells. The purely optical coupling between a photon multiplier film and an underlying low band gap solar cell is advantageous because it puts fewer requirements on the singlet fission material functionality, for example, no requirement to generate and conduct current. In addition, the photon multiplier film can be developed independently of the well-optimised commercial cell production.

WO 2014/052530 A1 discloses a singlet fission photon multiplier film which is used as an organic sensitizing window layer deposited over a silicon cell. The organic sensitizing window layer consists of a singlet fission host material containing a phosphorescent emitter dopant, where the singlet fission host material has a triplet energy greater than or equal to the triplet energy of the phosphorescent emitter dopant.

A singlet produced upon the absorption of one high energy photon by the singlet fission host undergoes fission into two triplets and each triplet is transferred to a separate phosphorescent emitter dopant. The process results in two near infrared photons being emitted from the phosphorescent emitter dopant which are subsequently absorbed into the adjacent silicon cell, producing two electron-hole pairs.

US 2014/0224329 A1 and WO 2016/009203 A1 each disclose a photon multiplying film having bi-layers comprising an acene and/or a lead chalcogenide quantum dot.

In these films, the non-emissive triplet excitons are transferred into the infrared emissive quantum dot by Dexter energy transfer which relies on orbital overlap between the excitation donor and the excitation acceptor.

The present invention is concerned with a photon multiplying film having a novel architecture comprising a light harvesting material.

The light harvesting material in the present invention increases the range of usable light for the organic semiconductor because it absorbs efficiently at wavelengths of light shorter than the absorption wavelengths of the organic semiconductor and then transfers energy to the organic semiconductor via a non-radiative transfer mechanism.

Light harvesting materials are well known and described in the literature. They typically comprise a luminescent material such as an organic dye, an organic pigment or a quantum dot. They may, in particular, comprise more than one organic dye, organic pigment or quantum dot which may be arranged in close proximity to one another, for example, in a polymer matrix.

One light harvesting material comprises a polystyrene microsphere containing six different dyes and shows efficient excitation energy transfer amongst the dyes. The five dyes with the highest first excited state levels transfer their excitations to the sixth dye with the lowest energy level with re-emission of light (see Roberts, D. V. et al., Efficient Excitation Energy Transfer Among Multiple Dyes in Polystyrene Microspheres" in Journal of Luminescence, 1988, (79), 225 to 231).

Another light harvesting material comprises a monolayer of different quantum dots in which Forster Resonance Energy Transfer (FRET) between the quantum dots is observed. The concentration of the quantum dots in the monolayer and the overlap of the quantum dot emission and absorption peaks can be used to control the efficiency of the energy transfer amongst the quantum dots (see Lunz, M. et al., "Influence of Quantum Dot Concentration on Forster Resonant Energy Transfer in Monodispersed Nanocrystal Quantum Dot Monolayers" in Physical Review, 2010, (B81), 205316).

Luminescent solar concentrators (LSC) are planar sheet materials which are doped with luminescent materials (such as dyes) that emit light and propagate it in waveguide modes towards the edges of the sheet. The concentrating effect is brought about because the surface area at the edges of the planar sheet is significantly smaller than the surface area of the planar sheet which intercepts the incident light.

A study of the photon trapping and energy transfer in multiple dye plastic matrices has shown that energy transfer between the dyes arises from two competing non-radiative processes (see Swartz, B. A. et al, "Photon Trapping and Energy Transfer in Multiple-Dye Plastic Matrices: An Efficient Solar-Energy Concentrator" in Optics Letters, 1977, (1), 73).

The energy transfer from a light harvesting material to an organic semiconductor capable of singlet fission is barely described in the literature and then without re-emission of light.

One example is found in "Enhanced External Quantum Efficiency in an Organic Photovoltaic Cell via Singlet Fission Exciton Sensitizer" by Reusswig, P. D. et al., in Applied Physics Letters 2012, 101, 113304. Here, enhanced external quantum efficiency in bilayer organic photovoltaic cells is obtained when a singlet exciton donor layer is paired with a singlet exciton fission layer so that a singlet generated in the donor layer can undergo singlet exciton fission. The triplet excitons produced by the singlet fission are separated into charge at the heterojunction of the photovoltaic cell and collected as a photocurrent.

In a first aspect, the present invention provides a photon multiplying film comprising a first organic semiconductor, a luminescer and a light harvesting material wherein the light harvesting material has a bandgap which provides that exciton states formed in the light harvesting material by absorbance of light can be energy transferred to the first organic semiconductor and the luminescer has a bandgap which provides that triplet exciton states formed in the first organic semiconductor can be energy transferred to the luminescer and wherein at least one the of first organic semiconductor and the light harvesting material is capable of singlet fission.

The exciton states formed in the light harvesting material may be singlet or singlet-like exciton states, or triplet or triplet-like exciton states.

The triplet exciton states formed in the first organic semiconductor may be produced by singlet fission in the first organic semiconductor or by energy transfer of triplet or triplet-like exciton states from the light harvesting material to the first organic semiconductor.

A first organic semiconductor capable of singlet fission is an organic semiconductor which supports singlet fission upon irradiation of the film with light of an appropriate wavelength.

Similarly, a light harvesting material capable of singlet fission is a material which collects light and supports singlet fission upon irradiation of the film with light of an appropriate wavelength. The light harvesting material may comprise a second organic semiconductor which supports singlet fission upon irradiation of the film with light of an appropriate wavelength and, optionally, a luminescent material.

In some embodiments, the first organic semiconductor is capable of singlet fission and the light harvesting material is not. In other embodiments, the light harvesting material is capable of singlet fission and the first organic semiconductor is not. Of course, each of the first organic semiconductor and the light harvesting material may be capable of singlet fission.

In one embodiment, the photon multiplying film comprises a layer of the first organic semiconductor in which the luminescer and the light harvesting material are provided.

In this embodiment, the luminescer and the light harvesting material comprise discrete entities which are distributed within the layer of the first organic semiconductor.

In another embodiment, the photon multiplying film comprises a layer of a host material in which the first organic semiconductor, the luminescer and the light harvesting material are provided.

In one such embodiment, the first organic semiconductor and the luminescer are discrete entities which are distributed within the layer of the host material with a sufficient proximity between the first organic semiconductor and the luminescer for energy transfer of exciton triplet states from the first organic semiconductor into the luminescer.

In another such embodiment, the first organic semiconductor is chemically attached to the luminescer. The density of first organic semiconductor ligands on the luminescer may or may not provide a sufficient proximity between the ligands for singlet fission to occur.

In both these embodiments, the light harvesting material is provided as a discrete entity within the layer of host material with a sufficient proximity between the light harvesting material and the first organic semiconductor for energy transfer of exciton states formed in the light harvesting material to the first organic semiconductor.

A photon multiplying film comprising a layer of a host material in which an organic semiconductor capable of singlet fission and a luminescer are provided as discrete materials within the layer is described in international patent application WO 2018/189527 A1—incorporated herein by reference in its entirety.

In some embodiments, the first organic semiconductor is chemically attached to the luminescer by a linking group which maintains a distance between the first organic semiconductor and the luminescer providing that triplet exciton states formed in the first organic semiconductor can be energy transferred into the luminescer.

The distance between the first organic semiconductor and the luminescer may, in particular, be less than 2.0 nm, preferably less than 1.0 nm and more preferably less than 0.5 nm.

In one embodiment, the first organic semiconductor chemically attached to the luminescer and is capable of singlet fission. In this embodiment, the linking group and the band gap of the luminescer provide that exciton triplet states formed by singlet fission in the attached first organic semiconductor can be energy transferred into the luminescer.

A photon multiplying film comprising a layer of a host material in which an organic semiconductor is chemically attached as a ligand to a luminescer and undergoes singlet fission is described in international patent application WO 2019/110971 A1—incorporated herein by reference in its entirety.

In these embodiments, the light harvesting material may not be capable of singlet fission and, in particular, may comprise a luminescent material.

The distribution of the luminescent material within the host material provides a sufficient proximity between the luminescent material and the first organic semiconductor so that singlet excitons formed in the luminescent material by the absorbance of light can be energy transferred to the first organic semiconductor.

The energy transfer between the light harvesting material and the first organic semiconductor may, in particular, occur through Forster Resonance Energy Transfer (FRET).

In other embodiments, the first organic semiconductor is chemically attached to the luminescer and is not capable of singlet fission. In this embodiment, the linking group and the band gap of the luminescer provide that exciton triplet states formed in the attached first organic semiconductor can be energy transferred into the luminescer.

In these embodiments, the light harvesting material is capable of singlet fission. The light harvesting material may comprise, or be comprised by, a second organic semiconductor which is capable of singlet fission.

In one such embodiment, the light harvesting material comprises a luminescent material and a second organic semiconductor capable of singlet fission. In this embodiment, singlet exciton states formed in the luminescent material can be energy transferred to the second organic semiconductor.

The distribution of the luminescent material and the second organic semiconductor within the host material provides sufficient proximity between the luminescent material and the second organic semiconductor for energy transfer of singlet exciton states formed in the luminescent material to the second organic semiconductor.

The distribution of the first organic semiconductor and the second organic semiconductor within the host material provides a sufficient proximity between the first organic semiconductor and the second organic semiconductor for triplet exciton states formed in the second organic semiconductor by singlet fission to be energy transferred to the first organic semiconductor.

The energy transfer between the light harvesting material and the first organic semiconductor may occur through a Dexter Energy Transfer (DET). The energy transfer between the luminescent material and the second organic semiconductor of the light harvesting material may occur through Forster Resonance Energy Transfer (FRET).

In still another embodiment, the light harvesting material is comprised by a second organic semiconductor and triplet exciton states formed in the second organic semiconductor by singlet fission can be energy transferred to the first organic semiconductor.

In this embodiment, the distribution of the first organic semiconductor and the second organic semiconductor within the host material provides a sufficient proximity between the first organic semiconductor and the second organic semiconductor so that triplet exciton states formed in the second organic semiconductor by singlet fission can be energy transferred to the first organic semiconductor.

The energy transfer between the light harvesting material and the first organic semiconductor may occur through a Dexter Energy Transfer (DET).

In all these embodiments, the energy transfer between the first organic semiconductor and the luminescer may also occur through Dexter Energy Transfer (DET).

Note that the distribution of the first organic semiconductor, the luminescer and the light harvesting material within the host material may be controlled, at least in part, by selection of the mass concentrations of the first organic semiconductor, the luminescer, the light harvesting material and the host material.

When the film is prepared by solution processing, the distribution may also be controlled by the choice of solvent and processing conditions (for example, temperature, and drying rate) for one or more of the first organic semiconductor, the luminescer, the light harvesting material and the host material.

The selection of mass concentration, choice of solvent and processing conditions is such that the structure (or morphology) of the film supports the required distance for one or more of the above-mentioned energy transfers (typically less than or equal to 4 nm in the case of FRET and typically less than or equal to 1 nm in the case of DET).

Note that varying the mass concentration of the host material provides for tuning of the photon multiplying film by varying the proximity of the first organic semiconductor, the luminescer and the light harvesting material to each other within the film.

The mass concentration of the host material may range between 0.0% and 99.9% of the mass of the film. In some cases, it may be less than 20.0%, for example, less than 10% or less than 5% of the mass of the film.

The mass concentration of light harvesting material may generally exceed the mass concentration of the first organic semiconductor in the host material.

The ratio of mass concentration of light harvesting material to mass concentration of the first organic semiconductor (whether or not chemically attached to the luminescer) may vary greatly depending on the choice of light harvesting material and first organic semiconductor. In one embodiment, the ratio may, for example, be between 2:1 and 100:1, in particular, between 10:1 and 80:1, for example, between 10:1 and 50:1—but in other embodiments it may differ by an order of magnitude or more.

As mentioned above, the light harvesting material may comprise, or be comprised by, a luminescent material and/or a second organic semiconductor which is capable of singlet fission.

The luminescent material may comprise, or be comprised by, one or more of an organic dye, an organic pigment or a colloidal inorganic nanocrystal, such as a quantum dot (as well as mixtures thereof).

The luminescent material may, in particular, comprise, or be comprised by, one or more (for example, two, three or four) of an organic dye.

In one embodiment, the luminescent material is comprised by a 50:50 mixture of 1,3,6,8(2H,7H)-tetraone,2,7-dicyclohexylbenzo [1 mn] [3,8]-phenanthroline and N,N'-bis(2,6-di-isopropylphenyl)-3,4,9,10-perylenetetracarboxylic diimide.

The organic dyes may be generally discrete from one another—but may assemble or associate with each other when they are provided together in the host material. They may be covalently bonded with one another or to a matrix material such as a polymer or oligomer.

The luminescent material may comprise, or be comprised by, a polymer or oligomer wherein the one or more of an organic dye, an organic pigment or a quantum dot are covalently bonded within and to the long chain, or as a side group to the long chain, of the polymer or oligomer molecule.

Alternatively, or additionally, the luminescent material may comprise, or be comprised by, one or more of a high bandgap quantum dot.

Suitable high bandgap quantum dots include those having a core structure comprising one or more of CdSe, CdS, ZnTe, ZnSe, HgS, HgSe, HgTe, HgCdTe, CdTe, CZTS, ZnS, $CuInS_2$, CuInGaSe, CuInGaS, Si, InAs, InP, InSb, $SnS_2$, CuS, graphene, and metal halide perovskites such as $CsPbBr_3$, $CsPbCl_3$, $CsPbBr_{3-x}Cl_x$.

The diameter of the quantum dots may be 50 nm or less, preferably 20 nm or less, preferably 10 nm or less, and more preferably 5 m or less.

In any case, the luminescent material may provide a plurality of luminescent entities wherein each luminescent entity has a different bandgap to any other luminescent entity such that light can be absorbed by any one of the luminescent entities and exciton singlet states generated therein can be energy transferred from that luminescent entity to a luminescent entity having an adjacent lower bandgap.

A singlet energy transfer may be repeated across multiple luminescent entities having adjacent lower bandgap until the luminescent entity having the most appropriate or lowest energy bandgap is reached.

In any case, the light harvesting material may comprise at least one luminescent entity having a bandgap in in the energy range 1.4 to 4.5 eV, preferably 2.0 to 4.0 eV and more preferably 2.2 to 4.0 eV.

The host material may comprise any organic material that modifies the morphology of the organic semiconductor, luminescer and light harvesting material to improve photon multiplication. The host material may or may not bond with one or other of the first organic semiconductor, luminescer or light harvesting material. It may comprise a small molecule, an oligomer, a homopolymer, a copolymer, a macromolecule, a dendrimer or a three-dimensional network of organic molecules.

The host material may be synthetic or natural in origin. It may include a wide variety of chemical structures providing for uniform dispersion of the organic semiconductor, the luminescent material and the light harvesting material. These chemical structures may include functional groups such as alcohol, carboxylic acid, thiol, primary, secondary or tertiary amine, phosphine, phosphonic, urethane, imide and silanol, which provide for hydrogen bonding of at least one the organic semiconductor, the luminescent material and the light harvesting material.

In preferred embodiments, the host material provides a film which is substantially transparent to visible and infrared light.

The host material may, in particular, comprise an organic polymer. The polymer can be selected from a wide variety of polymers and their derivatives including polybutyrals, polyamides, polyurethanes, polythiols, polyesters, polymethacrylates, polymethylmethacrylates, epoxies, polycarbonates, polyolefins, EVAs, silicones.

The host material may also be selected from suitable macromolecules of natural origin including carbohydrates, proteins, nucleic acids and lipids.

The first organic semiconductor may be chosen so that it has a triplet energy greater than the bandgap of the luminescer. Preferably, the triplet energy of the first organic semiconductor is +/− 0.4 eV of the bandgap of the luminescer, preferably +/− 0.3 eV, and more preferably +/− 0.2 eV.

In some embodiments, the first organic semiconductor has a bandgap in the range 1.4 to 4.0 eV, preferably 2.0 to 3.0 eV and more preferably 2.3 to 2.6 eV.

The first organic semiconductor and the second organic semiconductor capable of singlet fission can be chosen from any organic material in which multiple exciton generation can take place.

The first and second organic semiconductor may, for example, be a small molecule, an oligomer, a homopolymer, a copolymer, a macromolecule, a dendrimer or an organometallic complex.

The first organic semiconductor and the second organic semiconductor may be designed with wide variation in chemical structure. They may comprise, or be comprised by, one or more of an acene, a perylene, a rylene, a diketopyrrolopyrrole, a fluorene, a carotenoid or a benzofuran moiety or molecule, a phenazinothiadiazole, an isoindigo-moiety or isoindigo-containing molecule (such as in the isoindigo-based polymer IIDDT-Me), a zethrene (diradicaloid) and a bithiophene (for example, a tetracyanomethylene quinoidal bithiophene).

These moieties or molecules may be unsubstituted or substituted by substituents. The substituents may, in particular, comprise $C_1$ to $C_{10}$ (for example, $C_1$ to $C_4$) alkyl, alkenyl or alkynyl groups.

The first organic semiconductor capable of singlet fission may, in particular, be 6,11-bis-((triisopropylsilyl)ethynyl) tetracene or a ligand derived from a substituted tetracene such as 6,11-bis-((triisopropylsilyl) ethynyl)tetracene-2-carboxylic acid.

The second organic semiconductor capable of singlet fission may, in particular, be 6,11-bis-((triisopropylsilyl) ethynyl)tetracene.

The luminescer may be chosen from any luminescent material to which excitations can be transferred from the first organic semiconductor and emitted at a lower energy.

The luminescer may, in particular, be an organic transition metal phosphorescent, a thermally activated delayed fluorescent (TADF), a quantum dot (metal chalcogenide, III-V, II-VI, Si, Ge, graphene, graphene oxide, metal halide perovskite), an emitter small molecule, oligomer, dendrimer, polymer or macromolecule or a 2D-material.

The quantum dot may have a core structure comprising one or more of CdSe, CdS, ZnTe, ZnSe, PbS, PbSe, PbTe, HgS, HgSe, HgTe, HgCdTe, CdTe, CZTS, ZnS, $CuInS_2$, $CuInSe_xS_{2-x}$, $CuGaS_2$, $AgInSe_2$, CuInGaSe, CuInGaS, silicon, InAs, InP, InSb, $SnS_2$, CuS, graphene, graphene oxide, a metal halide perovskite, germanium and $Fe_2S_3$.

The diameter of the quantum dots may be 50 nm or less, preferably 20 nm or less, preferably 10 nm or less, and more preferably 5 nm or less.

In preferred embodiments, the luminescer has an energy bandgap in the range of 0.6 eV to 2.0 eV, preferably 0.8 eV to 1.7 eV, more preferably 0.9 eV to 1.4 eV.

In embodiments in which the luminescer is not chemically attached to the organic semiconductor, the quantum dot may be passivated sterically with an organic ligand, for example, with a ligand comprising a short to medium chain thiol (such as 1-octanethiol) or hydrocarbon carboxylic acid (such as octanoic acid).

In embodiments in which the luminescer is chemically attached to the organic semiconductor, the quantum dot may include passivating ligands such as those described above as well as those ligands including a semiconductor moiety derived from an organic semiconductor molecule.

The photon multiplying film may absorb light of a first wavelength (for example, visible light) and re-emit the light at a second wavelength that is lower than the first wavelength (for example, infra-red light).

Note that the photoluminescence quantum efficiency (PLQE) of the film may or may not be greater than 100%. It may, in particular, be between 1% and 200% or 5% and 200%.

In a second aspect, the present invention provides a photon multiplying film comprising a light harvesting material, a first organic semiconductor capable of singlet fission and a luminescer wherein the light harvesting material comprises a luminescent material having a bandgap which provides that singlet exciton states formed in the luminescent material by absorbance of light can be energy transferred to the first organic semiconductor, and the luminescer has a bandgap which provides that triplet exciton states formed in the first organic semiconductor by singlet fission can be energy transferred to the luminescer.

The first organic semiconductor may be attached to the luminescer by a chemical linking group. Alternatively, the first organic semi-conductor and the luminescer may be provided as discrete entities within the film.

In a third aspect, the present invention provides a photon multiplying film comprising a light harvesting material, a first organic semiconductor and a luminescer, wherein the light harvesting material comprises a second organic semiconductor which second organic semiconductor is capable of singlet fission and has a bandgap which provides that triplet exciton states formed by singlet fission therein by absorbance of light can be energy transferred from the second organic semiconductor to the first organic semiconductor, and the luminescer has a bandgap which provides that triplet exciton states formed in the first organic semiconductor can be energy transferred to the luminescer.

The first organic semiconductor may or may not be capable of singlet fission.

In a fourth aspect, the present invention provides a photon multiplying film comprising a light harvesting material, a first organic semiconductor and a luminescer, wherein the light harvesting material comprises a luminescent material and a second organic semiconductor which second organic semiconductor is capable of singlet fission and wherein the luminescent material has a bandgap which provides that singlet exciton states formed in the luminescent material by absorbance of light can be energy transferred to the second organic semiconductor and has a bandgap which provides that triplet exciton states formed by singlet fission on the energy transfer of singlet excitons from the luminescent material to the second organic semiconductor can be energy transferred from the second organic semiconductor to the first organic semiconductor, and the luminescer has a bandgap which provides that triplet exciton states formed in the first organic semiconductor can be energy transferred to the luminescer.

The first organic semiconductor may or may not be capable of singlet fission.

In a fifth aspect, the present invention provides an exciton multiplying film. The exciton multiplying film may comprise substantially the same constituents as described for the film of the first to fourth aspects of the present invention.

In a sixth aspect, the present invention provides an opto-electronic device comprising a photon or exciton multiplying film according to the first or fourth aspect in optical communication with an opto-electronic element such as a solar cell, a photodetector, a light-emitting diode, a field-effect transistor, a display, a sensor or a biological imaging device.

Embodiments in the second to sixth aspects of the present invention will be apparent from those described in relation to the first aspect.

The present invention will now be described in more detail by way of example only and having regard to the following description and the accompanying drawings in which.

Figure 9:
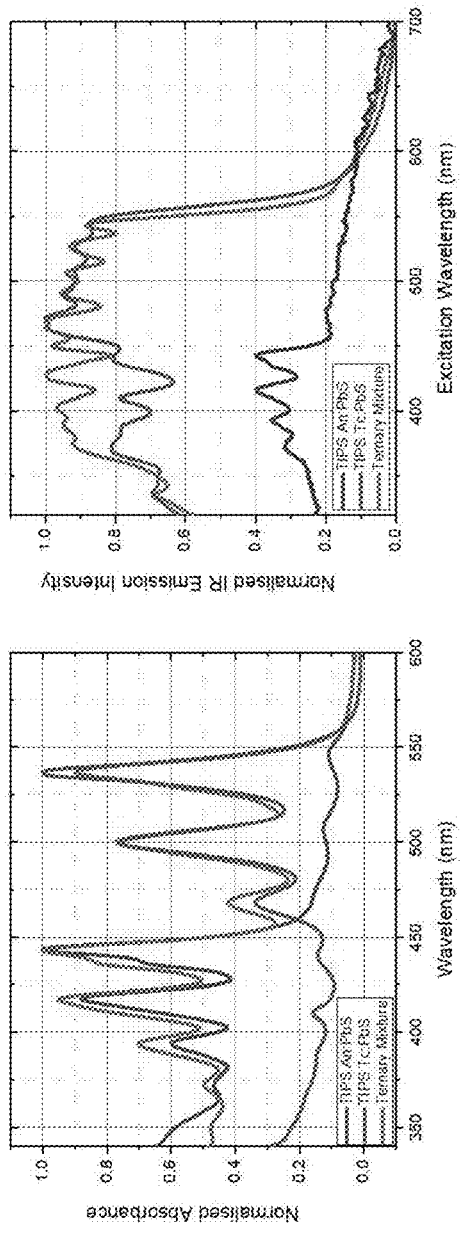
Figure 10:
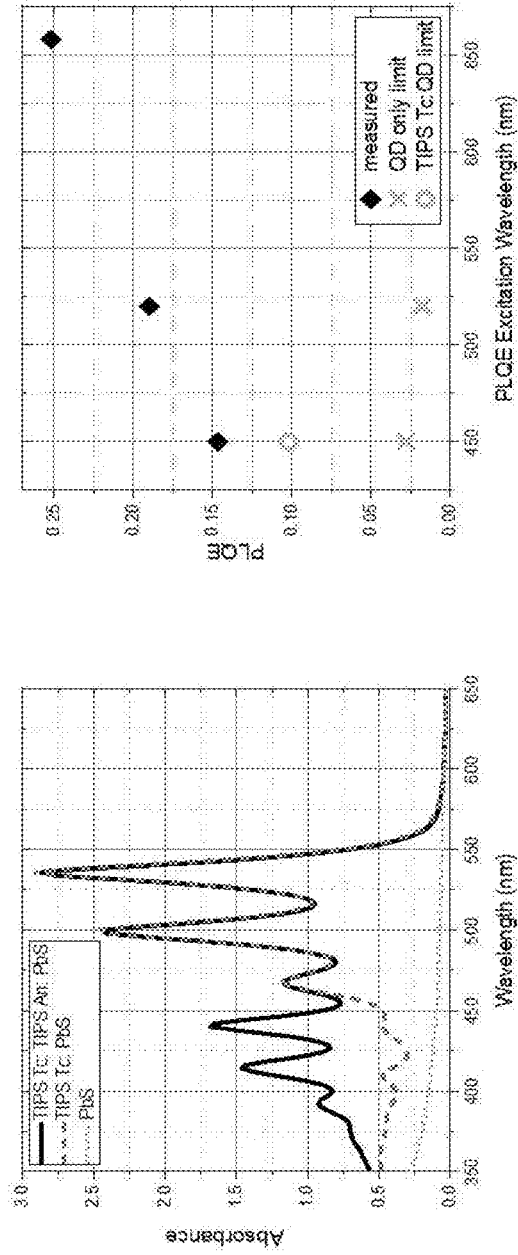

FIG. 9 shows normalised absorbance and emission spectra of a photon multiplying film according to still another embodiment of the present invention at wavelengths between 300 nm and 700 nm of incident light; and FIG. 10 shows absorbance spectra of a photon multiplying film according to yet another embodiment of the present invention as compared to other films and a plot of photoluminescence quantum efficiency (PLQE) of the photon-multiplying film at excitation wavelengths of 450 nm, 532 nm and 658 nm.

The patent or application file contains at least one drawing executed in color. Copies of this patent or patent application publication with color drawing(s) will be provided by the Office upon request and payment of the necessary fee.

Figure 1:
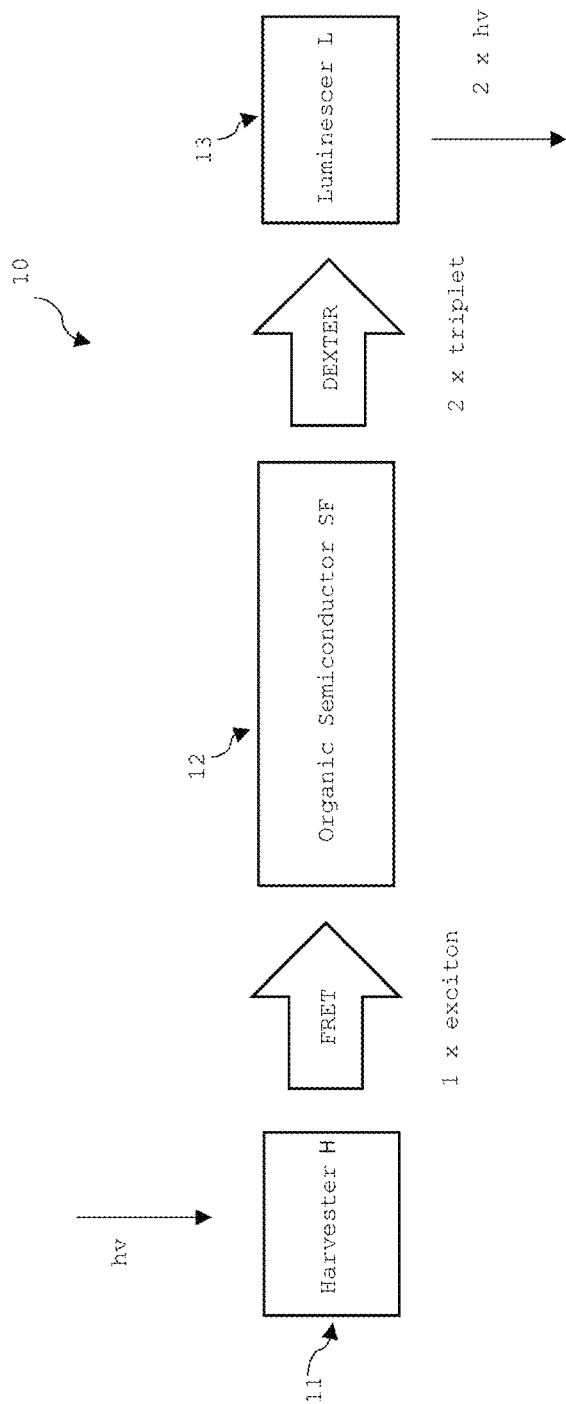
FIG. 1 is a scheme showing the absorbance, emission and energy transfer processes involved in some embodiments of the present invention.

Referring now to FIG. 1, a photon multiplying film in accordance with the present invention, generally designated 10, comprises a light harvesting material 11 (Harvester H), an organic semiconductor capable of singlet fission 12 (SF) and a luminescer 13 (L).

In this film, the organic semiconductor 12 (SF) and the luminescer 13 (L) may be discrete entities (SF+L) or chemically attached to each other ([SF+L]).

FIG. 1 shows light (hv) incident upon the film being absorbed by the light harvesting material 11(H) whereby to generate an exciton state which is energy transferred by FRET to an exciton singlet state in the organic semiconductor 12 (SF).

Singlet fission of the exciton singlet state in the organic semiconductor 12 (SF) generates triplet exciton states which are efficiently and sequentially transferred to the luminescer 13(L) by DET.

The electron hole pairs generated in the luminescer 13(L) by triplet energy transfer recombine with the emission of light (hv).

Thus, the film may provide that every high energy photon absorbed by the light harvesting material 11(H) leads to the emission of two low energy photons.

Figure 2:
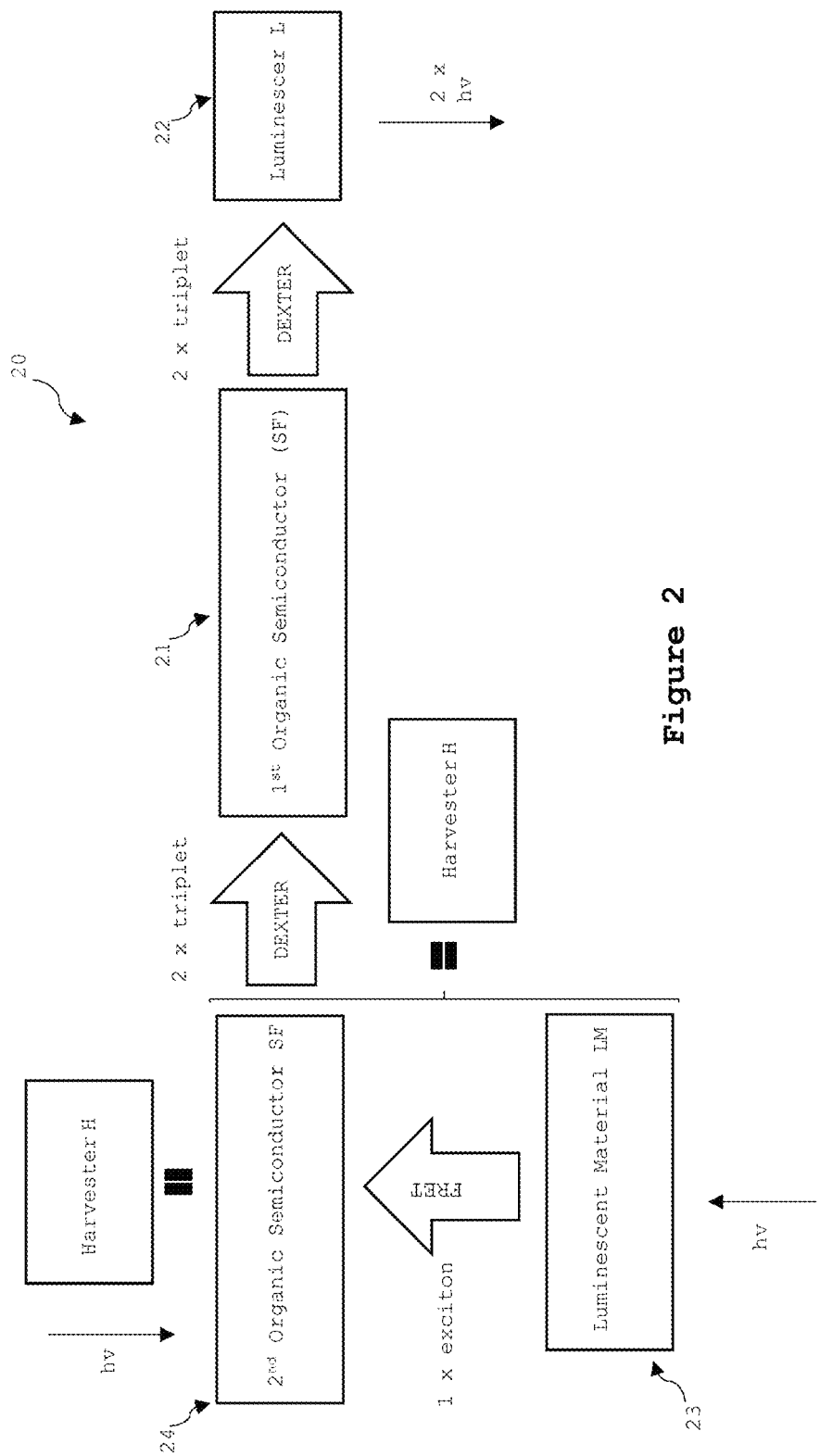
FIG. 2 is a scheme showing the absorbance, emission and energy transfer processes involved in other embodiments of the present invention.

Referring now to FIG. 2, a photon multiplying film in accordance with the present invention, generally designated 20, comprises a first organic semiconductor 21 and a luminescer (L) 22.

In this film, the first organic semiconductor 21 is chemically attached to the luminescer ([(SF)+L] but may not undergo singlet fission.

In that case, the light harvesting material (H) consists of a luminescent material (LM) 23 and a second organic semiconductor capable of singlet fission (SF) 24.

Alternatively, the light harvesting material (H) consists of a second organic semiconductor capable of singlet fission (SF) 24.

FIG. 2 shows light (hv) incident upon the film (LM+SF+[SF'+L]) being absorbed by the luminescent material (LM)

23 whereby to generate an exciton singlet state which is transferred by FRET to the second organic semiconductor (SF) 24.

Alternatively, light incident upon the system (SF+[SF'+ L]) is absorbed by the second organic semiconductor (SF) 24.

Singlet fission of the exciton singlet state in the second organic semiconductor (SF) 24 generates triplet exciton states which are transferred to the first organic semiconductor ((SF)) 21 by DET.

The triplet exciton states which are transferred to the first organic semiconductor ((SF)) 21 are efficiently transferred to the luminescer (L) 22 by DET.

The electron hole pairs generated in the luminescer (L) 22 by the transfer of triplet excitons recombine with the emission of light (hv).

Thus, the film may also provide that every high energy photon absorbed by the light harvesting material (H) leads to the emission of two low energy photons.

Figure 3:
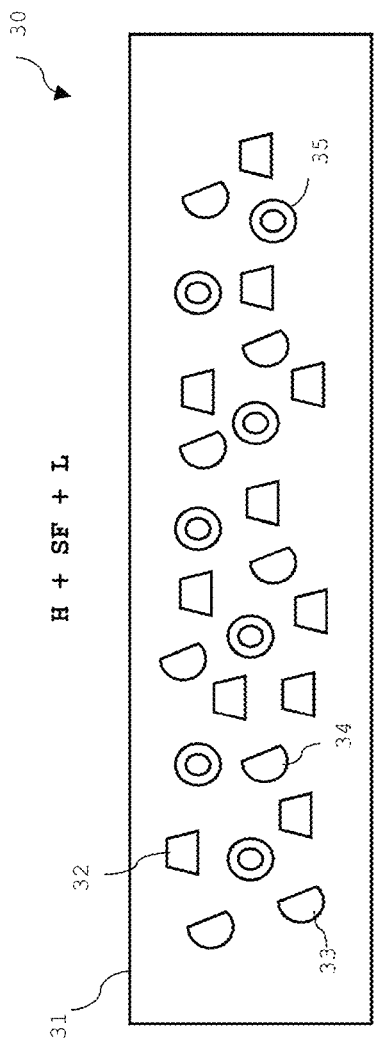
FIG. 3 is a schematic illustration of a photon multiplying film according to one embodiment of the present invention.

Referring now to FIG. 3, a photon multiplication film according to an embodiment of the present invention, generally designated 30, comprises a poly(methyl methacrylate) (PMMA) film 31 in which an organic semiconductor capable of singlet fission (SF), bis((triisopropylsilyl)ethynyl)tetracene (TIPS-Tet) 32, a light harvesting material (H) consisting of the organic dyes 1,3,6,8(2H,7H)-tetraone,2,7-dicyclohexyl-benzo[1 mn][3,8]phenanthrolline 33 and N,N'-bis(2,6-diisopropyl-phenyl)-3,4,9,10-perylenetetracarboxylic diimide 34 and a luminescer (L) comprising lead sulphide (PbS) quantum dots 35 are dispersed.

In this embodiment (H+SF+L), the PbS quantum dots 35 and the organic dyes 33, 34 are uniformly dispersed in the PMMA film 31 so that the distance between quantum dots 35 and organic dyes 33, 34 is less than or equal to the Forster Transfer radius for these materials (around 4 nm).

The organic semiconductor (TIPS-Tet) 32 is dispersed in the PMMA film 21 so that the distance between the organic semiconductor (TIPS-Tet) 32, the quantum dots 35 and the organic dyes 33, 34 is close enough for diffusion of singlet and triplet excitons through the film and for triplet transfer into the quantum dots 35 without inhibition of singlet fission or aggregation of the quantum dots 35.

Figure 4:
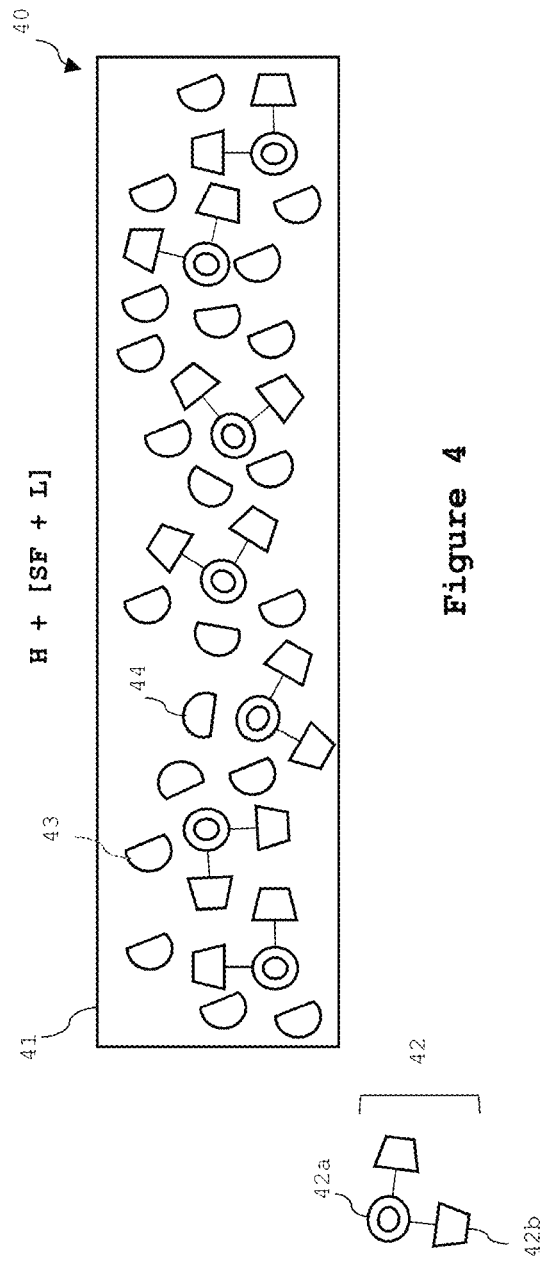
FIG. 4 is a schematic illustration of a photon multiplying film according to another embodiment of the present invention.

Referring now to FIG. 4, a photon multiplying film according to another embodiment of the present invention, generally designated 40, comprises a polymethylmethacrylate (PMMA) film 41 in which a photon multiplying material 42, comprising a luminescer of PbS quantum dots 42a having an outer coating including an organic semiconductor (ligands) 42b derived from 6,11-bis(triisopropylsilyl)ethynyl)-tetracene-2-carboxylic acid (PbS/TIPS-Tet-CA quantum dots), and a light harvesting material consisting of 2 organic dyes 1,3,6,8(2H,7H)-tetraone,2,7-dicyclohexyl-benzo[1 mn][3,8]phenanthroline 43 and N,N'-bis(2,6-diisopropylphenyl)-3,4,9,10-perylenetetracarboxylic diimide 44 are dispersed.

In this embodiment (H+[SF+L]) the PbS/TIPS-Tet-CA quantum dots 42 and the organic dyes 43, 44 are uniformly dispersed in the PMMA film 41 so that the distance between the quantum dots 42 and the organic dyes 43, 44 is less than or equal to the Forster Transfer radius for these materials (around 4 nm). The distance between the organic semiconductor 42b and the quantum dot 42a is determined by the linking group and is generally less than or equal to 1 nm to enable DET to occur.

EXAMPLE 1

A Photon Multiplying Film (H+[SF+L])

Preparation of a Passivated Quantum Dot

Passivated lead sulphide quantum dots were synthesised according to a modification of literture method of Hines, M. A. and Scholes, G. D., in Advanced Materials, 2003, 15(21), 1844-1349.

Lead oxide (PbO, 0.62 g, 2.3 mmol), oleic acid (8 ml, 22.4 mmol, 7.2 g acceptor) and octadecene (25.0 ml, 76.3 mmol, 19.5 g) were stirred together in a three-neck reaction flask and degassed at 110° C. under vacuum ($10^{-2}$Mbar or better).

After two (2) hours, the reaction flask was flushed with nitrogen and the solution heated to 115° C. solution of bis(trimethyl-siliyl)sulphide (TMS, $(Me_3Si)_2S$, 286 μl, 1.4 mmol) in octadecene ($C_{18}H_{-36}$, 13.9 ml, 42.4 mmol, 10.8 g) was rapidly added to the flask and the reaction immediately quenched by placing the reaction flask in an ice-water bath.

Lead sulphide (PbS) quantum dots passivated by hydrocarbon ligands from oleic acid. (OA) were isolated from the reaction mixture by flocculating to turbidity with hexane as solvent and a mixture of 1-buthanol/ethanol/octane as the anti-solvent.

After filtration, passivated (PbS-OA) quantum dots were washed and re-dispersed in octane toluene at a concentration of about 10 mg to 100 mg per ml. The dispersion was stored under an atmosphere of argon at standard temperature and pressure.

Note that the bandgap of the passivated quantum dots could be tuned by adjustment of the oleic acid (OA) concentration in the reaction mixture or by adjustment of the temperature of the reaction.

Preparation of the Photon Multip Quantum Dot [SF+L]

A ligand exchange reaction was performed on the passivated quantum dots (PbS-OA) according to the procedure of Garakyaraghi, S. et al., in Journal of Physical Chemistry Letters, 2017, 8(7), 14581463, using 6,11-bis-((triisopropylsiyl)ethynyl)tetracene-2-carboxylic acid (TIPS-Tet-CA) for the new ligand.

To a stirred solution of the passivated quantum dots (20 mg) in toluene (1 ml) was added TIPS-Tet-CA (in excess). The resulting solution was stirred in the dark for 16 hours and acetone added to precipitate the PbS/TIPS-Tet-CA quantum dots.

The PbS/TIPS-Tet-CA quantum dots were collected by centrifugation at 4000 rpm for 5 minutes and (following removal of the supernatant) dispersed in toluene (1 mL).

These quantum dots were purified by repeating (for example, six times or more) the precipitation, dispersal and centrifugation steps until no free TIPS-Tet-CA was detectable in the solution. Finally, the PbS/TIPS-Tet-CA quantum dots were dispersed in toluene (1 mL), and stored under nitrogen in the dark at −20° C.

Note that the ligand exchange reaction can also be carried by adding sodium salt of TIPS-Tet-CA to a solution of the passivated quantum rots (20 mg) in a mixture of toluene and tetrahydrofuran. (THF).

Selection of Light Harvesting Material (H)

Figure 5:
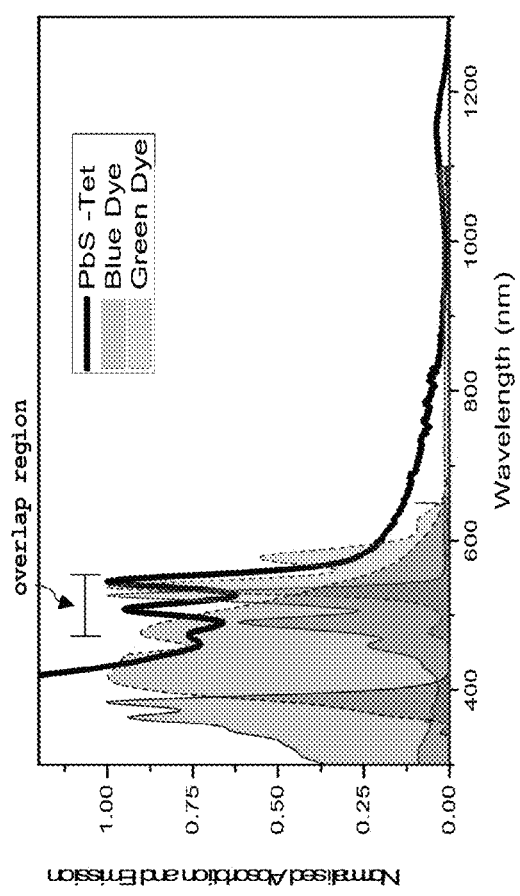
FIG. 5 is a graph showing the emission spectrum of a light harvesting material (comprising two organic dyes) and the absorbance of PbS-Tet.

Referring now to FIG. 5, the normalised absorption spectrum of the PbS quantum dots with the attached tetracene ligands (labelled PbS-Tet) shows strong oscillations arising from the absorbance of the tetracene ligands in the "overlap region". The normalised absorption (thin continuous line) and emission (thin dashed line) spectrum of each of the organic dye molecules N,N'-bis(2,6-diisopropylphenyl)-3,4,9,10-perylenetetracarboxylic diimide and 1,3,6,8

(2H,7H)-tetra-one,2,7-dicyclohexyl-benzo[1 mn][3,8] phenanthroline (respectively designated blue or B and green or G) show good overlap with the absorbance of the tetracene ligands of the PbS/TIPS-Tet-CA quantum dots—suggesting the possibility of FRET between the organic dyes and the Tet-ligands on the quantum dots.

Preparation of Photon Multiplying Film (H+[SF+L])

Poly(methyl methacrylate) (PMMA) and organic dyes 1,3,6,8(2H,7H)-tetraone,2,7-dicyclohexylbenzo[1 mn][3,8] phenanthroline and N,N'-bis(2,6-diisopropylphenyl)-3,4,9, 10-perylenetetracarboxylic diimide were dissolved in toluene or chloroform and the solution sealed and heated to 100° C. with stirring overnight. After cooling and opening to an inert atmosphere, PbS/TIPS-Tet-CA quantum dots were added to the solution with stirring at room temperature. After 30 minutes, the resulting suspension was spread out onto a glass substrate and the solvent allowed to dry in air at room temperature.

The dye quantities and quantum dot quantities are milligram quantities which lead to a mass concentration of the dyes and the quantum dot in the PMMA film between 0.1% to 5.0% of the PMMA film.

Performance of Photon Multiplying Film (H+[SF+L])

A study of the absorbance and emission spectra of the photon multiplying film (the PbS-Tet BG film) as compared to the absorbance and emission spectra of a PMMA film containing PbS/TIPS-Tet-CA quantum dots (PbS-Tet film), a PMMA film containing PbS/TIPS-Tet-CA quantum dots and 1,3,6,8(2H,7H)-tetraone,2,7-dicyclohexylbenzo[1 mn][3,8]-phenanthroline (PbS-Tet G) and a PMMA film containing PbS/TIPS-Tet-CA quantum dots and N,N'-bis(2,6-diisopropylphenyl)-3,4,9,10-perylene-tetracarboxylic diimide (PbS-Tet B film) was undertaken.

The absorbance spectrum of each of the films was measured using a Shimadzu UV 600 spectrometer with attached integrating sphere at wavelengths between 300 nm and 600 nm.

Figure 6:
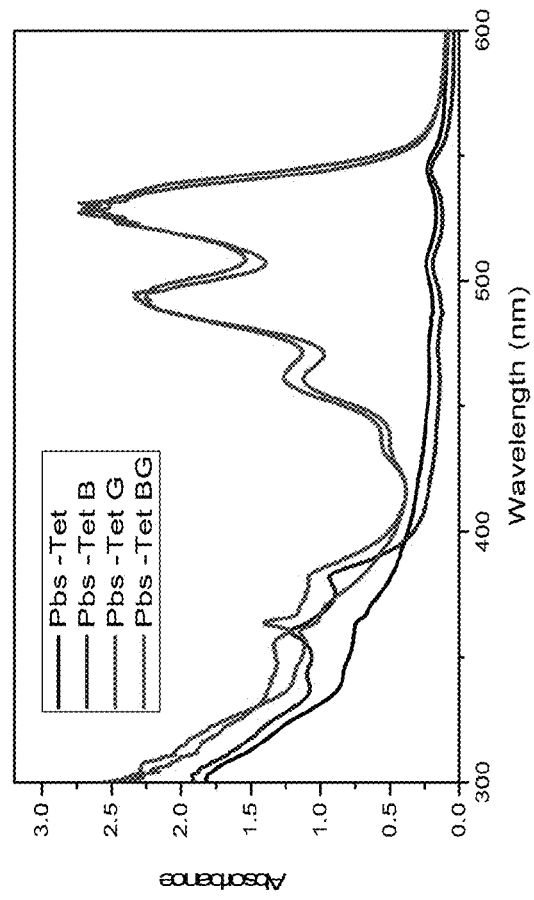
FIG. 6 is a graph showing the absorbance spectrum of a photon multiplying film according to an embodiment illustrated in FIG. 4 at wavelengths of incident light between 300 nm and 600 nm as compared to the absorbance spectra of other films.

Referring now to FIG. 6, the absorbance spectrum of the PbS-Tet BG film and the absorbance spectrum of the PbS-Tet G film both show increased absorbance in the region between 450 nm and 550 nm as compared to the absorbance spectrum of the PbS-Tet film.

Note in this regard, the barely visible absorption features at 475 nm, 510 nm and around 545 nm in the absorbance spectrum of the PbS-Tet film (which correspond to the peaks shown in the overlap region of FIG. 5).

In the region between 350 nm and 400 nm, however, the absorbance spectra of the PbS-Tet G, PbS-Tet B and PbS-Tet BG films all show increased absorbance as compared to the absorbance spectrum of the PbS-Tet film.

The photoluminescence emission spectrum for each film was measured using an Edinburgh Instruments FLS90 fluorimeter. Film samples were excited in an integrating sphere by front face illumination with continuous wave laser at wavelengths 405 nm, 520 nm and 785 nm (for excitation of respectively the blue dye, mainly the green dye and the quantum dot) and at an angle of 45° to the surface. The emissions were detected at an angle of 90° to the excitation angle and 45° to the surface using a calibrated Andor iDus DU490A InGaAs detector. Note that the fluence for these measurements was kept low in order to avoid two photon absorption.

The photoluminescence quantum efficiency (PLQE) of the films was calculated according to the method of de Mello, J. et al., "An Improved Experimental Determination of External Photoluminescence Quantum Efficiency" in Advanced Materials 1997, 9(3) 230-232. The method accounts for photons absorbed by direct excitation, indirect excitation following scattering in the integrating sphere and by sample emission.

Figure 7:
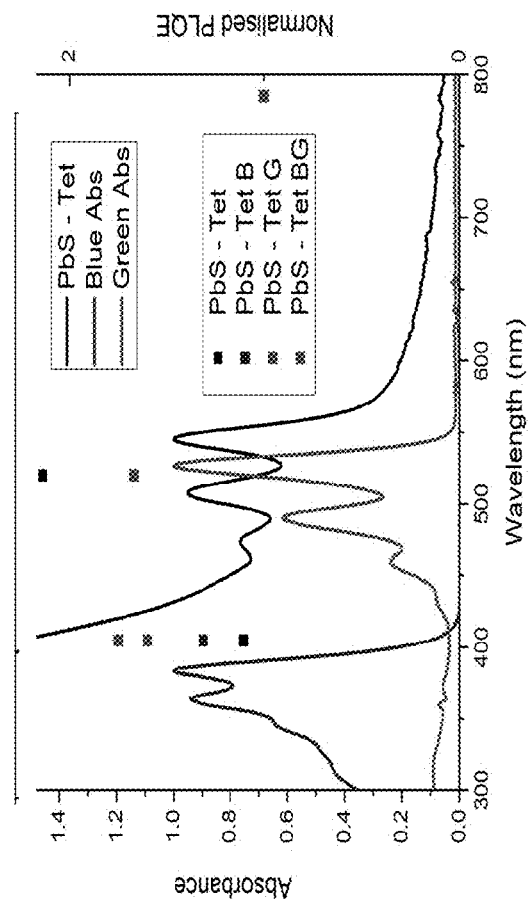
FIG. 7 shows a plot of normalised photoluminescence quantum efficiency (PLQE) of a photon multiplying films according to the embodiment illustrated in FIG. 4 at excitation wavelengths of 405 nm, 520 nm and 785 nm.

Referring now to FIG. 7, a plot of normalised photoluminescence quantum efficiency (PLQE) of the films at the 3 different wavelengths (405 nm, 520 nm and 785 nm) is superposed upon the normalised absorbance spectra of the dyes (B and G) and the PbS-Tet-CA quantum dots.

As may be seen, the PLQE value for the PbS-Tet film at 520 nm is greater than that of the PbS-Tet BG film at 785 nm and that of the PbS-Tet film at 405 nm because singlet fission is occurring in the Tet ligand and the Tet ligand does not absorb at 405 nm and 785 nm. The PLQE values for the PbS-Tet BG film at 785 nm and the PbS-Tet film at 405 nm are similar because only direct excitation of the PbS quantum dots occurs at these wavelengths.

The PLQE value for the PbS-Tet B film is greater at 405 nm as compared to excitation of the PbS-Tet BG film at 785 nm because FRET between the blue dye and the Tet ligand in the PbS-Tet B film enables singlet fission to occur whereas at 785 nm only direct excitation of the PbS quantum dot occurs.

The PLQE value for the PbS-Tet G film is higher at both 405 nm and 520 nm as compared to that of the film at 785 nm because of FRET between the green dye and the Tet ligands and because the green dye absorbs light at both 405 nm and 520 nm.

The PLQE value for the PbS-Tet BG film at 405 nm excitation is higher than the PLQE values for both the PbS-Tet B film and the PbS-Tet G film—showing that singlet excitons produced in the blue dye are transferred by FRET to the green dye and that the green dye transfers the excitons into the Tet ligand more efficiently than the blue dye alone would. So much is consistent with FIG. 5 wherein a better overlap of the emission spectrum of the green dye with the absorption spectrum of the Tet ligand as compared to the overlap of the emission spectrum of the blue dye with the absorption spectrum of the Tet ligand is seen.

EXAMPLE 2

A Photon Multiplying Film (H=SF and [(SF)+L])

Preparation of Photon Multiplying Films (H=SF and [(SF)+L])

A ligand exchange reaction was performed on passivated quantum dots (PbS-OA) as described in Example 1 except that the excess of 6,11-bis-((triisopropylsilyl)ethynyl)tetracene-2-carboxylic acid (TIPS-Tet-CA) used did not provide sufficient density of the ligand on the quantum dot for singlet fission (indicated by (SF)).

The PbS/TIPS-Tet-CA quantum dots so obtained showed an emission wavelength peak at 1300 nm and a mass ratio of oleic acid ligand to 6,11-bis-((triisopropylsilyl) ethynyl) tetracene-2-carboxylic acid ligand of 10 to 1.

A toluene solution of these quantum dots ([(SF)+L], 5,12-bis-((triisopropylsilyl)ethynyl)tetracene (TIPS-Tet, SF) and a polystyrene of molecular weight greater than 500 kD was made up to an equivalent mass ratio of PbS/TIPS-Tet-CA quantum dots to polystyrene of 2 to 1.

The toluene solution was blade coated onto a glass substrate and the coated substrate dried in an inert (nitrogen) atmosphere. The resultant substrate, carrying a film comprising a dispersion of PbS/TIPS-Tet-CA quantum dots ([(SF)+L]) and 5,12-bis-((triiso-propylsilyl)ethynyl)tetracene (TIPS-Tet, SF) in a polystyrene matrix (PS), was rim encapsulated with a transparent and inert polyisobutylene polymer, so that the material did not contact the part of the coating to be measured.

A toluene solution containing only PbS/TIPS-Tet-CA quantum ([(SF) L]), 5,12-bis-((triisopropylsilyl)ethynyl)tetracene (TIPS-Tet, SF) was blade coated onto another glass substrate and the coated substrate dried in an inert (nitrogen) atmosphere. The resultant substrate, carrying a film comprising a dispersion of PbS/TIPS-Tet-CA quantum dots ((SF) L) in 5,12-bis-((triisopropylsilyl)ethynyl)-tetracene (TIPS-Tet, SF) was rim encapsulated with a transparent polymer barrier material.

Performance of Photon Multiplying Films (H=SF and [(SF)+L])

Photoluminescence quantum efficiency (PLQE) measurements on the encapsulated substrates were conducted in an integrating sphere at excitation wavelengths of 520 nm and 658 nm with continuous-wave lasers.

Figure 8:
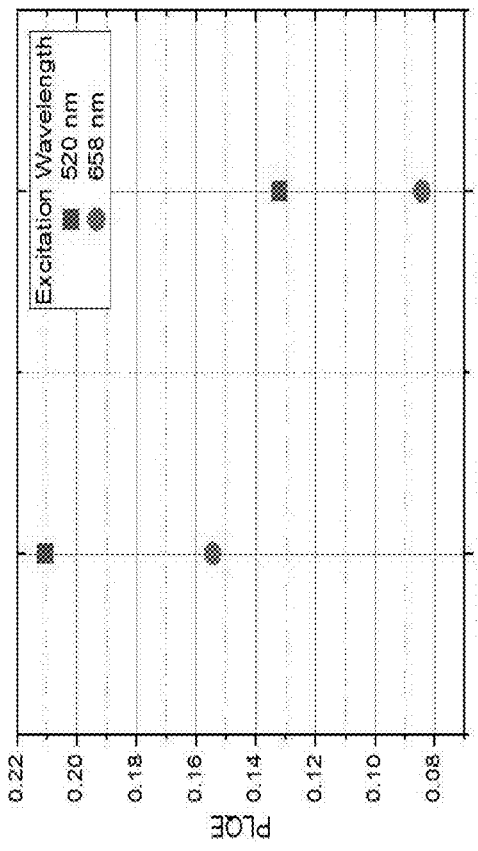
FIG. 8 shows a plot of photoluminescence quantum efficiency (PLQE) of a photon multiplying film according to another embodiment of the present invention at excitation wavelengths of 520 nm and 658 nm of incident light.

Referring now to FIG. 8 (in which the PbS/TIPS-Tet-CA quantum dots [(SF+1]) are indicated as TIPS Tc:AL QD), at the excitation wavelength of 520 nm over 95% of the light absorbed by each substrate generates excitations on the TIPS-Tet with the remainder being absorbed by the PbS/TIPS-Tet-CA quantum dots. At the excitation wavelength of 658 nm there is no absorption by TIPS-Tet and 100% absorption by the PbS/TIPS-Tet-CA quantum dots in each substrate.

Accordingly, the PLQE measurements at 658 nm represent the intrinsic PLQE of the PbS/TIPS-Tet-CA quantum dots ([(SF)+L]) and the difference in PLQE measurements at 520 nm has to be due to excitors multiplication in the film by singlet fission in TIPS-Tet (SF) followed by an efficient triplet exoiton transfer in the film from TIPS-Tet (SF) to the PbS/TIPS-Tet-CA quantum dots ([(SF)+L]).

EXAMPLE 3

A Photon Multiplying Film (H=LM+SF and [(SF)+L])

Preparation of Photon Multiplying Film (H=LM+SF and [(SF)+L]

Solutions of the PbS/TIPS-T-t-CA quantum dots ([(SF)+L]) obtained in Example 2 were made up with one or other or both of TIPS anthracene (TIPS-An, LM) and TIPS tetracene (TIPS-Tet, SF) to a mass ratio of organic semiconductor to PbS/TIPS-Tet-CA quantum dots of 5:1.

The solutions were each doctor bladed onto respective glass substrates and the substrates dried in an inert (nitrogen) atmosphere. The coated glass substrates, carrying a film of PbS/TIPS-Tet-CA quantum dots ([(SF)+L]) dispersed in organic semiconductor (s) (LM and SF) were sealed with a transparent and inert polyisobutylene polymer by a robust rim encapsulation ensuring no contact between the polymer and the film.

Performance of Photon Multiplying Film (H=LM+SF and [(SF)+L])

Referring now to FIG. 9, there is shown plots of normalised absorbance and normalised emission for each of the (three) coated substrates.

As may be seen, the absorbance spectra of the film comprising PbS/TIPS-Tet-CA quantum dots ([(SF)+L]) in TIPS-An (LM) show multiple peaks between 350 nm and 450 nm. These peaks correspond to absorbance transitions occurring in TIPS-An (LM).

By contrast, the film comprising PbS/TIPS-Tet-CA quantum dots ([(SF)+L]) and TIPS-Tet (SF) shows strong absorbance between 450 nm and 500 nm. The film comprising PbS/TIPS-Tet-CA quantam dots ([(SF)+L]) and both TIPS-An (LM) and TIPS-Tet (SF) shows broad absorbance between 350 nm and 550 nm.

The emission spectrum (centred at 1300 nm) of the film comprising PbS/TIPS-Tet-CA quantum dots ([(SF)+L]) in TIPS-An (LM) showed an excitation reflecting only a modest energy transfer from TIPS-An (LM) to the PbS/TIPS-Tet-CA quantum dots ([(SF)+L])—suggesting a low energy transfer efficiency which does not involve singlet fission.

By contrast, the corresponding emission spectrum of the film comprising PbS/TIPS-Tet-CA quantum dots ([(SF)+L]) in TIPS-Tet (SF) shows a large increase in the intensity of PbS/TIPS-Tet-CA quantum dot emission—again demonstrating a rapid singlet fission in TIPS-Tet (SF) and efficient energy transfer in the film from TIPS-Tet (SF) to the PbS/TIPS-Tet-CA quantum dot ([(SF)+L]).

Further, the corresponding excitation spectrum of the film comprising PbS/TIPS-Tet-CA quantum dot ([(SF)+L]), TIPS-Tet (SF) and TIPS-An (LM) shows a relative increase in emission between 350 nm and 450 nm—suggesting an effective energy transfer within the film from TIPS-An (LM) to TIPS-Tet (SF).

Note here that if this energy transfer was not effective, a substantially reduced emission between 350 nm and 450 nm would be observed—because of the absorbance of TIPS-An (LM) at these wavelengths.

EXAMPLE 4

A Photon Multiplying Film (H=LM and SF and L)

Preparation of the Photon Multiplying Film (H=LM and SF and L)

A first solution of the passivated quantum dot PbS-OA (L) obtained in Example 1 was made up with TIPS anthracene (TIPS-An, LM) and TIPS tetracene (TIPS-Tet, SF) to a mass ratio of TIPS-Tet (SF) to TIPS-An (LM) to PbS-OA (L) of 10 to 2.5 to 1.

A second solution of passivated quantum dot PbS-OA was made up with TIPS-Tet (SF) to a mass ratio of TIPS-Tet (SF) to PbS-OA quantum dots (L) of 5:1.

The solutions were doctor bladed onto a glass substrate and dried in an inert (nitrogen) atmosphere. The coated glass substrates, carrying a film of PbS-OA quantum dots (L) dispersed TIPS-Tet (SF) or in TIPS-Tet (SF) and TIPS-An (SF and LM) were sealed within a transparent and inert polyisobutylene polymer by a robust rim encapsulation ensuring no contact between the polymer and the polymer film.

Performance of Photon Multiplying Film (H=LM and SF and L)

Referring now to FIG. 10, there is shown the absorbance spectra of the encapsulated substrates as compared to those for PbS-OA quantum dots and a plot of PLQE measurements on the substrate containing the film of PbS-OA quantum dots (L) dispersed in TIPS-Tet (SF).

As may be seen, the absorbance spectrum for the film comprising PbS/TIPS-OA quantum dot (L), TIPS-Tet (SF) and TIPS-An (LM) shows a clear contribution between 350 nm and 450 nm from TIPS-An.

The PLQE measurement on excitation at 658 nm represents the intrinsic PbS/TIPS-OA quantum dot emission yield. (because the organics do not absorb beyond 600 nm) and shows that 25% of the excitations produced (infra-red) emission.

The excitation of the film at 520 nm shows a PLQE measurement (u) of 19% indicating that the TIPS-Tet (SF) in the films undergoes rapid singlet fission to produce triplet excitons.

As absorbance at this wavelength is dominated by TIPS-Tet (SF) such a PLQE yield, far in excess of that expected to arise solely from excitation of the PbS-OA quantum dot (L) (shown by X at 520 nm) indicates that an energy transfer of triplet excitons into the Pb-OA quantum dot (L) is taking place within the film.

Note here that if no energy transfer of triplet excitons into the Pb-OA quantum dot (L) was to occur, only absorbance by Pb-OA could contribute to the PLQE and the PLQE of the films would be less than 2%.

The excitation of the film at 450 nm is shared approximately equally between the TIPS-An (LM) and the combined absorption of TIPS-Tet (SF) and the PbS-OA quantum dot (L) (as is evidenced by the absorbance spectra). The PLQE measurement (u) of the film shows a PLQE of 14% indicating that excitations on the TIPS-An (LM) are transferred to TIPS-Tet (SF) within the film before being passed on from TIPS-Tet (SF) to the PbS-OA quantum dot (L).

Note here that if there were no energy transfer between the organic semiconductors and the PbS-OA quantum dot, the PLQE of the film could not exceed about 3% (shown by X at 40 nm, QD only limit). Further, if there were no energy transfer between TIPS-An (LM) and TIPS-Tet (SF), the PLQE of the film could not exceed about 10% (shown by O at 450 nm, TIPS Tc:QD limit).

This study shows photon multiplying films having PLQE that is enhanced by the presence of a light harvesting material and, in particular, the collection of light from substantially the whole of the visible spectrum and its injection into an organic semiconductor capable of singlet fission by non-radiative energy transfer.

Although some of the examples show photon multiplying films having a PLQE less than 100%, each of these films clearly demonstrate the functioning elements of photon multiplying film viz, the harvesting of visible light by absorption in a luminescent material, transfer of singlet excitons generated by FRET to a singlet fission material, exciton multiplication in the singlet fission material producing triplet exciton states exceeding the number of singlet exciton states, diffusion of the triplet exciton states and Dexter transfer into a quantum dot and emission of (infrared) photons from the quantum dot.

Note here that it is the emission of light from the PbS/TIPS-Tet-CA quantum dots that is inefficient (significantly less than 50% in the examples, meaning that the photon multiplication quantum efficiency for the whole system cannot be greater than 100%—even if all elements other than the quantum dots are performing perfectly). However, quantum dots with optimised core size and structure (potentially other PbS) can be expected to provide much higher intrinsic PLQE.

The present invention may offer significant advantages over the photon multiplying films described in international patent applications WO 2018/189527 A1 and WO 2019/110971 A1.

A light harvesting material comprising organic dyes may mean that the photon multiplying film requires fewer quantum dots per unit volume—especially when they are coupled with the organic semiconductor, thus reducing direct and unwanted absorbance and re-emission in the quantum dots.

The light harvesting material absorbs in regions where the singlet fission molecule does not absorb well so boosting the overall absorption of the photon multiplying film.

Because the dyes can energy transfer to the singlet fission material, there is less need for a relatively thick coating of Tet ligands on the quantum dot to absorb light.

The present invention may reduce complexity in manufacture of a photon multiplying film (and opto-electronic device using the film) because photon absorbance and singlet fission can be separated and managed independently.

Note that references herein to an "energy bandgap" or a "bandgap" of a particular material or entity are, except where the context otherwise demands, references to an optical band gap of that material or entity.

The invention claimed is:

1. A photon multiplying material comprising:
   a first organic semiconductor;
   a light harvesting material and a luminescer wherein the light harvesting material has a bandgap which provides that exciton states formed in the light harvesting material by absorbance of light can be energy transferred to the first organic semiconductor and the luminescer has a bandgap which provides that triplet exciton states formed in the first organic semiconductor can be energy transferred into the luminescer; and
   wherein at least one of the first organic semiconductor and the light harvesting material is capable of singlet fission; and further wherein either:
   a) the first organic semiconductor is chemically attached to the luminescer by a linking group and the linking group and the band gap of the luminescer provide that exciton triplet states formed in the attached first organic semiconductor can be energy transferred into the luminescer; or
   b) the first organic semiconductor is capable of singlet fission and is not attached to the luminescer.

2. The photon multiplying material according to claim 1, wherein the first organic semiconductor, the luminescer and the light harvesting material are provided within a host material.

3. The photon multiplying material according to claim 1, wherein the first organic semiconductor is chemically attached to the luminescer by the linking group and the linking group and the band gap of the luminescer provide that exciton triplet states formed in the attached first organic semiconductor can be energy transferred into the luminescer.

4. The photon multiplying material according to claim 1, wherein the first organic semiconductor is capable of singlet fission and is not attached to the luminescer.

5. The photon multiplying material according to claim 3, wherein the light harvesting material is comprised by a luminescent material and provides that exciton states formed therein by the absorbance of light can be energy transferred to the first organic semiconductor.

6. The photon multiplying material according to claim 3, wherein the light harvesting material comprises a luminescent material and a second organic semiconductor capable of singlet fission wherein exciton states formed in the luminescent material can be energy transferred to the second organic semiconductor.

7. The photon multiplying material according to claim 6, wherein triplet exciton states formed in the second organic semiconductor by singlet fission can be energy transferred to the first organic semiconductor.

8. The photon multiplying material according to claim 3, wherein the light harvesting material comprises a second organic semiconductor capable of singlet fission and wherein triplet exciton states formed in the second organic semiconductor by singlet fission can be energy transferred to the first organic semiconductor.

9. The photon multiplying material according to claim 5, wherein the luminescent material comprises one or more of an organic dye, an organic pigment or a quantum dot.

10. The photon multiplying material according to claim 9, wherein the luminescent material comprises a plurality of luminescent entities, wherein each luminescent entity has a different bandgap to any other luminescent entity such that light can be absorbed by any one of the luminescent entities and excitons produced therein can be energy transferred from that luminescent entity to a luminescent entity having an adjacent lower bandgap.

11. The photon multiplying material according to claim 9, wherein the luminescent material has at least one bandgap in the energy range 1.4 eV to 4.5 eV, preferably 2.0 eV to 4.5 eV and more preferably 2.2 eV to 4.0 eV.

12. The photon multiplying material according to claim 1, wherein the luminescer has a bandgap in the range of 0.6 eV to 2.0 eV, preferably 0.8 eV to 1.7 eV, and more preferably 1.0 eV to 1.5 eV.

13. The photon multiplying material according to claim 1, wherein the triplet energy of the first organic semiconductor is within 0.4 eV of the bandgap of the luminescer, preferably within 0.3 eV, and more preferably within 0.2 eV.

14. The photon multiplying material according to claim 1, wherein the first organic semiconductor has a bandgap in the range 1.4 to 4.0 eV, preferably 2.0 to 3.0 eV and more preferably 2.3 to 2.6 eV.

15. The photon multiplying material according to claim 1, wherein the first organic semiconductor comprises one or more of an acene, a perylene, a rylene, a diketopyrrolopyrrole, a fluorene, a carotenoid or a benzofuran a phenazinothiadiazole, an isoindigo-moiety or isoindigo-containing molecule (such as in the isoindigo-based polymer IIDDT-Me), a zethrene (diradicaloid) and a bithiophene (for example, a tetracyanomethylene quinoidal bithiophene).

16. The photon multiplying material according to claim 6, wherein the second organic semiconductor comprises one or more of an acene, a perylene, a rylene, a diketopyrrolopyrrole, a fluorene, a carotenoid or a benzofuran a phenazinothiadiazole, an isoindigo-moiety or isoindigo-containing molecule (such as in the isoindigo-based polymer IIDDT-Me), a zethrene (diradicaloid) and a bithiophene (for example, a tetracyanomethylene quinoidal bithiophene).

17. The photon multiplying material according to claim 1, wherein the luminescer is an organic transition metal phosphorescent, a thermally delayed fluorescent, a colloidal nanocrystal, such as a quantum dot, or an emitter small molecule, oligomer, dendrimer, polymer, macromolecule or 2-D material.

18. The photon multiplying material according to claim 17, wherein the quantum dot has a core structure comprising one or more of CdSe, CdS, ZnTe, ZnSe, PbS, PbSe, PbTe, HgS, HgSe, HgTe, HgCdTe, CdTe, CZTS, ZnS, $CuInS_2$, $CuGaS_2$, $CuInSe_xS_{2-x}$, $AgInSe_2$, CuInGaSe, CuInGaS, silicon, InAs, InP, InSb, $SnS_2$, CuS, graphene, graphene oxide, a metal halide perovskite, germanium and $Fe_2S_3$.

19. The photon multiplying material according to claim 17, wherein the quantum dot has a diameter of 50 nm or less, preferably 20 nm or less, preferably 10 nm or less, and more preferably 5 nm or less.

20. The photon multiplying material according to claim 2, wherein the host material is as an organic material selected from a small molecule, an oligomer, a homopolymer, a copolymer, a macromolecule, a dendrimer or a 3D network of organic molecules.

21. The photon multiplying material according to claim 2, wherein the host material is selected from the group consisting of polybutyrals, polyamides, polyurethanes, polythiols, polyesters, polymethacrylates, polymethylmethacrylates, epoxies, polycarbonates, polyolefins, EVAs, silicones, carbohydrates, proteins, nucleic acids and lipids.

22. An opto-electronic device comprising the photon multiplying material according to claim 1 in optical communication with an opto-electronic element such as a solar cell, a photodetector, a light-emitting diode, a field-effect transistor, a display, a sensor or a biological imaging device.

* * * * *